US009892034B2

(12) United States Patent
Lee et al.

(10) Patent No.: US 9,892,034 B2
(45) Date of Patent: Feb. 13, 2018

(54) SEMICONDUCTOR DEVICE AND OPERATING METHOD THEREOF

(71) Applicants: SK hynix Inc., Gyeonggi-do (KR); Industry-University Cooperation Foundation Hanyang University, Seoul (KR)

(72) Inventors: Tae-Hwa Lee, Seoul (KR); Yoon-Jang Joe, Incheon (KR); Jae-Hyuk Cha, Gyeonggi-do (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 326 days.

(21) Appl. No.: 14/724,612

(22) Filed: May 28, 2015

(65) Prior Publication Data
US 2016/0259723 A1    Sep. 8, 2016

(30) Foreign Application Priority Data

Mar. 2, 2015 (KR) ........................ 10-2015-0028785

(51) Int. Cl.
| | |
|---|---|
| G06F 12/00 | (2006.01) |
| G06F 12/02 | (2006.01) |
| G11C 8/06 | (2006.01) |
| G11C 16/10 | (2006.01) |
| G11C 16/26 | (2006.01) |

(52) U.S. Cl.
CPC ............ *G06F 12/0292* (2013.01); *G11C 8/06* (2013.01); *G11C 16/10* (2013.01); *G11C 16/26* (2013.01); *G06F 2212/7201* (2013.01)

(58) Field of Classification Search
CPC ........ G06F 12/0292; G11C 8/06; G11C 16/10
See application file for complete search history.

(56) References Cited

U.S. PATENT DOCUMENTS

| | | | |
|---|---|---|---|
| 2010/0223421 A1 | 9/2010 | Kim et al. | |
| 2013/0166824 A1* | 6/2013 | Shim | G06F 12/0246 711/103 |
| 2015/0081969 A1* | 3/2015 | Tanaka | G06F 3/0644 711/114 |

FOREIGN PATENT DOCUMENTS

KR     1020100055565     5/2010

OTHER PUBLICATIONS

Wang, M., et al., Capturing the spatio-temporal behavior of real traffic data, Performance Evaluation, 2002, pp. 147-163, vol. 49, No. 1.
Hu, X., et al., Write amplification analysis in flash-based solid state drives, Proceedings of SYSTOR 2009: The Israeli Experimental Systems Conference Article, 2009.
Kwon, O., et al., FeGC: An efficient garbage collection scheme for flash memory based storage systems, The Journal of Systems and Software, 2011, pp. 1507-1523, vol. 84.

(Continued)

*Primary Examiner* — Gurtej Bansal
(74) *Attorney, Agent, or Firm* — IP & T Group LLP

(57) ABSTRACT

A semiconductor device includes a mapping table that stores a corresponding relation between a logical address defined on a basis of regions and a physical address defined on a basis of extents, wherein one or more extents are dynamically allocated to one region.

13 Claims, 10 Drawing Sheets

(56) References Cited

OTHER PUBLICATIONS

Chang, L., On efficient wear-leveling for large-scale flash-memory storage systems, Proc. of the 2007 ACM symposium on Applied computing, 2007, pp. 1126-1130.
Hynix, 2Gb NAND FLASH HY27UF(Aug. 2016)2G2B Datasheet, 2008.
Lee, K., et al, Smart layers and dumb result: IO characterization of an android-based smartphone, Proceedings of the tenth ACM international conference on Embedded software, 2012, pp. 23-32.
Kim, H., et al., Revisiting storage for smartphones, ACM Transactions on Storage (TOS), 2012, pp. 1-14, vol. 8, No. 4.
Eom, M., Flash Memory Based Bottom Up Analysis for Smart Phone System, in Proc. of NVRAMOS2012, 2012.
Bouganim, L., et al., uFLIP: Understanding flash IO patterns, In Proc. of CIDR, 2009.
Li, Z., et al. C-Miner: Mining Block Correlations in Storage Systems. In Proc. of FAST04, 2004.
Chung, T., et al., A survey of flash translation layer. J. Syst. Archit., 2009, pp. 332-343, vol. 55.
Kim, J., et al., A space-efficient flash translation layer for compact flash systems, IEEE Transactions on Consumer Electronics, 2002, pp. 366-375, vol. 48, No. 2.
Lee, W., et al., A log buffer based flash translation layer using fully associative sector translation, ACM Transactions on Embedded Computing Systems, 2007, vol. 6, No. 3.
Wang, M., et al., Capturing the spatio-temporal behavior of real traffic data, Performance Evaluation, 2002, pp. 147-163, vol. 49.

\* cited by examiner

SEMICONDUCTOR DEVICE AND OPERATING METHOD THEREOF

The present application claims priority under 35 U.S.C. § 119(a) to Korean application number 10-2015-0028785, filed on Mar. 2, 2015, in the Korean Intellectual Property Office, which is incorporated herein by reference in its entirety as set forth in full.

BACKGROUND

1. Technical Field

The present invention relates to a semiconductor device and an operation method thereof. Particularly, the present invention relates to a semiconductor device that controls mapping between a logical address requested from a host and a physical address of a memory device, and an operation method thereof.

2. Related Art

FIG. 1 is a block diagram illustrating a general memory system. The memory system may include a host 1 and a memory device.

The host 1 designates a logical address and requests the memory device 2 to perform a read/write operation. The memory device may include a control unit 3, a memory cell array 4, and a mapping table. The control unit 3 finds a physical address corresponding to the logical address with reference to the mapping table 30, and performs the read/write operation by using the physical address of the memory cell array 4.

When the memory device 2 is a NAND flash memory, page mapping, block mapping and the like are performed as a mapping scheme between a logical address and a physical address.

FIG. 2 is a diagram for explaining a conventional page mapping technology.

In the page mapping technology, the mapping table 30 stores a corresponding relation between a logical page address 10 managed by the host 1 and a physical page address 20 managed by the memory device 2.

To this end, the mapping table 30 should have storage areas 31 corresponding to at least the number p of the logical page addresses 10. Furthermore, the size of each storage area 31 should have enough data width to identify physical pages form one another.

For example, when the total number of physical pages is $2^N$, the data width of each storage area 31 is N, and thus, the size of the mapping table 30 is P×N.

As described above, the page mapping technology has a problem where as the number of physical pages (i.e., the size of the memory cell array 4) increases, the size of the mapping table 30 excessively increases.

FIG. 3 is a diagram for explaining a conventional block mapping technology.

In the block mapping technology, a page address is hierarchized into a block address and an offset number for management. FIG. 3 illustrates as an example in which one block includes two pages.

An offset number 12 of a logical page address and an offset number 22 of a physical page address correspond identically to each other. Accordingly, it is sufficient if the mapping table 30 stores a corresponding relation between a logical block address 11 and a physical block address 21.

In FIG. 3, since the number B of logical block addresses 11 is ½ of the number of logical page addresses, the number of storage areas 31 of the mapping table 30 used in the block mapping technology is reduced to ½ as compared to when the page mapping technology is employed.

Furthermore, since the number of physical block addresses 21 is also ½ of the number of physical page addresses, the data width of storage areas 31 of the mapping table 30 is also reduced. For example, when the number of physical pages is $2^N$, the number of physical blocks is $2^{N-1}$ and, thus the data width of storage areas 31 is reduced to (N−1).

When employing the block mapping technology, the size of the mapping table is reduced as compared to when the page mapping technology is employed.

However, since the corresponding relation between the offset number 12 of the logical block address 11 and the offset number 22 of the physical block address 21 is fixed, frequent write requests for the same logical address may also lead to frequent erasures for the corresponding page or memory cell.

FIG. 4 is a diagram for explaining a conventional partition recognition mapping technology.

In the partition recognition mapping technology, a page address is hierarchized into a partition number and an offset number.

A partition number 13 managed by the host 1 and a partition number 23 in the memory device 2 correspond to each other in a one-to-one manner. FIG. 4 illustrates as an example that two partitions are included.

The mapping table 30 is divided into two lower mapping tables 31 and 32 corresponding to the number of partitions.

The lower mapping table 31 stores a corresponding relation between an offset number 14 of a page belonging to a logical partition 0 and an offset number 24 of a page belonging to a physical partition 0 according to the page mapping technology.

The lower mapping table 32 stores a corresponding relation between an offset number 14 of a page belonging to a logical partition 1 and an offset number 24 of a page belonging to a physical partition 1 according to the page mapping technology.

In the partition recognition mapping technology, the number of storage areas of the mapping table is substantially the same as that of the page mapping technology, but the size of each storage area is reduced. As a consequence, the size of the mapping table in the partition recognition mapping technology is smaller than the size of the mapping table in the page mapping technology.

However, also in the partition recognition mapping technology, when a request is concentrated on a specific partition, the corresponding partition is quickly consumed as compared with other partitions, thereby reducing efficiency in using the entire storage space.

SUMMARY

An address mapping device capable of reducing the size of a mapping table and simultaneously reducing the number of erase operations, write operations, and garbage collections by dynamically expanding a physical address region corresponding to a specific logical address region when a request is concentrated on the logical address region, and an operation method thereof are described herein.

In one embodiment of the present invention, a semiconductor device includes a mapping table suitable for storing a corresponding relation between a logical address defined on a basis of regions and a physical address defined on a basis of extents, wherein one or more extents are dynamically allocated to one region.

In another embodiment of the present invention, an operating method of a semiconductor device includes storing a corresponding relation between a logical address including a region number and a region offset and a physical address including an extent number and an extent offset in first and second tables, wherein the first table stores an extent number index and the extent offset in a first index corresponding to the logical address, and the second table stores the extent number in a second index calculated by the region number and the extent number index, checking a physical address corresponding to a read-requested logical address by referring to the first table and the second table in response to a read request, and updating the first table or the second table in response to a write request.

The address mapping device and the operation method thereof according to the present technology are employed, so as to reduce the size of a mapping table. When a request is concentrated on a specific logical address region, a physical address region corresponding to the logical address region is dynamically expanded, so as to reduce the number of erase operations, write operations, and garbage collections.

Consequently, when a storage space is limited as with a mobile device it is possible to reduce the waste of the storage space due to an increase in the size of a mapping table and to substantially prevent performance degradation due to frequent background operations.

BRIEF DESCRIPTION OF THE DRAWINGS

Features, aspects, and embodiments are described in conjunction with the attached drawings, in which.

DETAILED DESCRIPTION

Hereinafter, a semiconductor device and an operation method thereof according to the present invention will be described in detail with reference to the accompanying drawings through exemplary embodiments.

Figure 1:
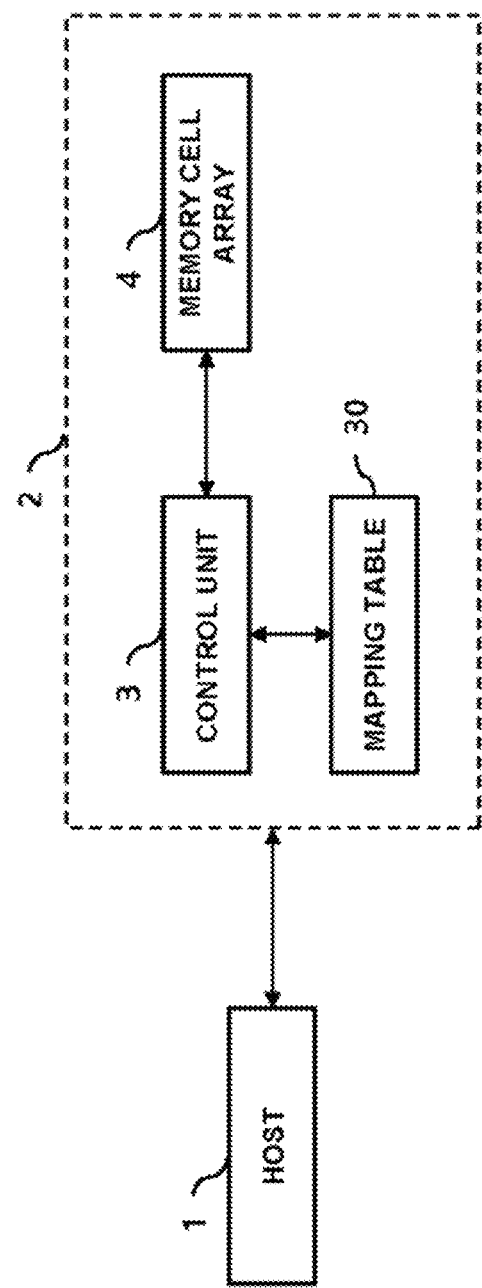
FIG. 1 is a block diagram illustrating a memory system.
Figure 2:
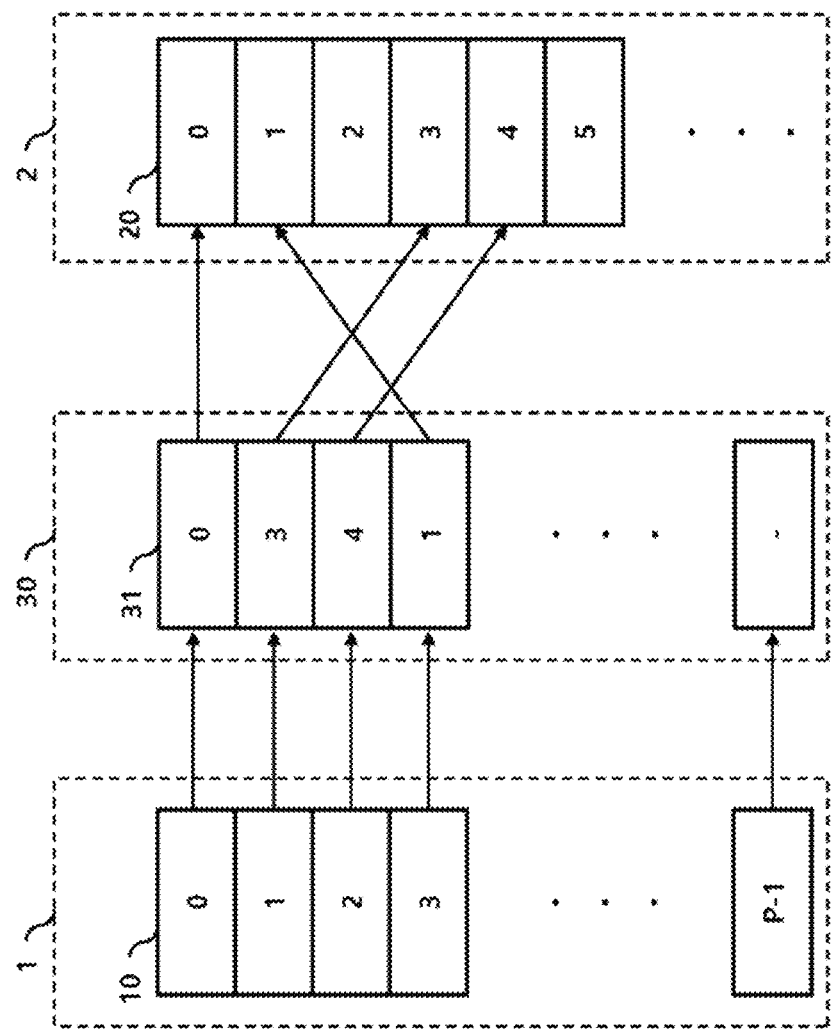
FIG. 2 to FIG. 4 are diagrams explaining conventional address mapping technologies.
Figure 3:
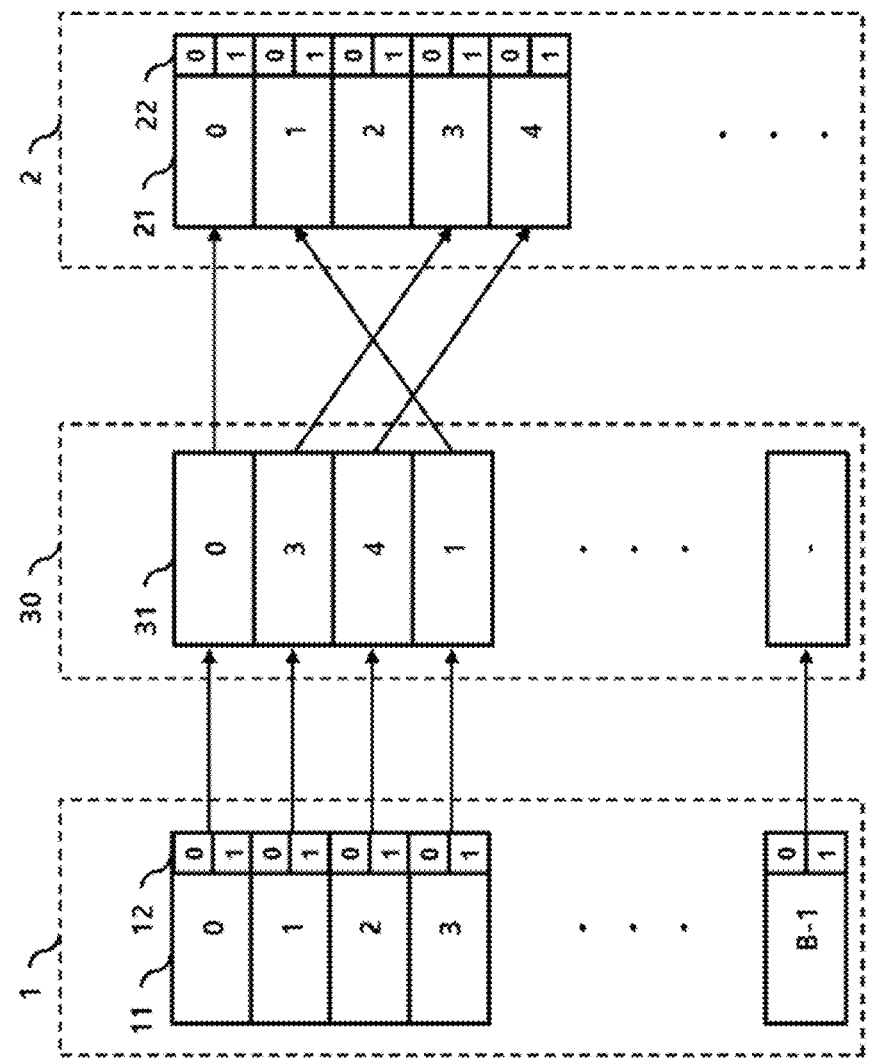
Figure 4:
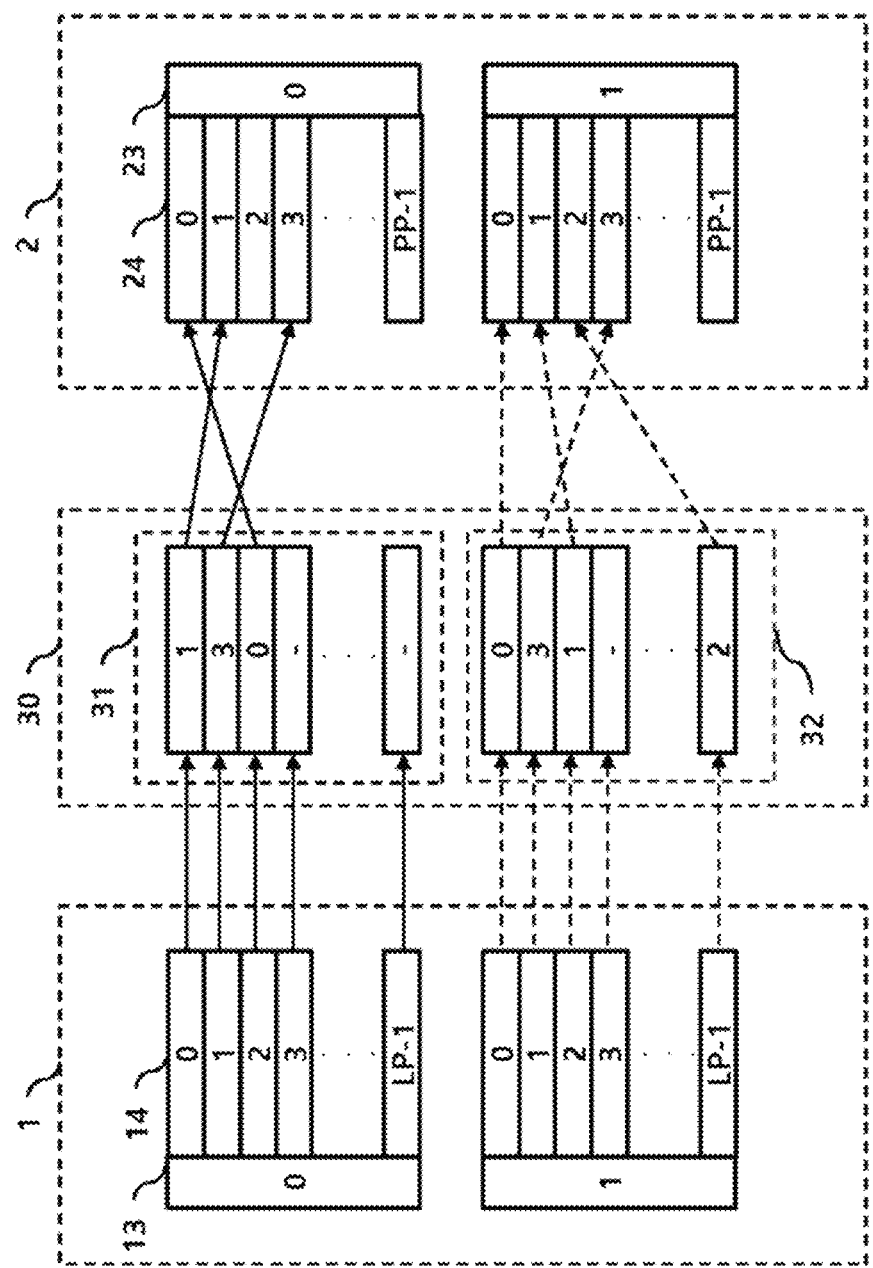
Figure 5:
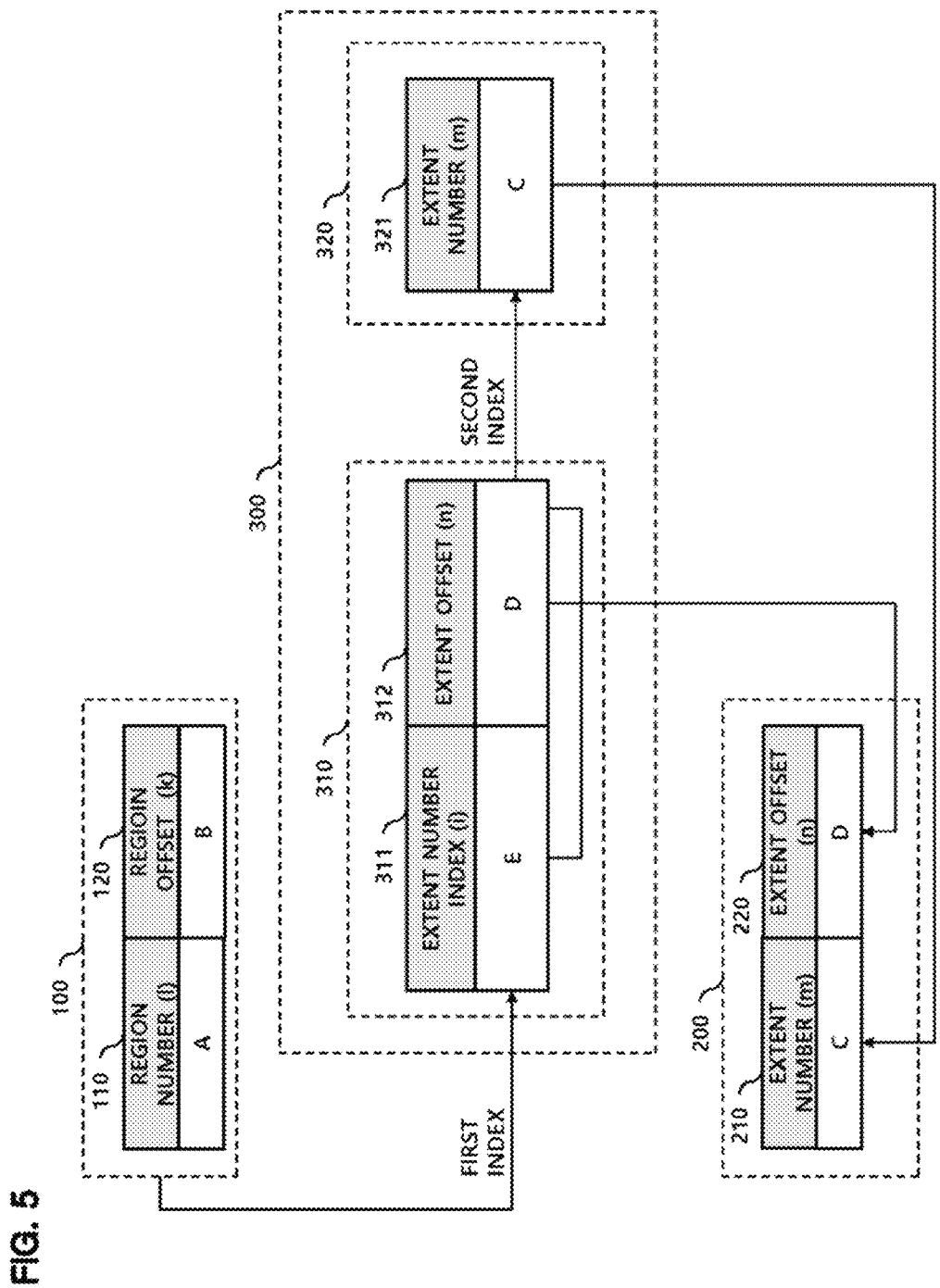
FIG. 5 is a diagram explaining an address mapping technology according to an embodiment of the present invention.

FIG. 5 is a diagram explaining a mapping technology according to an embodiment of the present invention.

In the present invention, a logical address 100 managed by a host 1 is hierarchized into a region number 110 and a region offset 120, and a physical address 200 managed by a memory device 2 is hierarchized into an extent number 210 and an extent offset 220. Hereinafter, an address indicates a page address.

In the present invention, a mapping table 300 includes a first table 310 and a second table 320.

The second table 320 stores a corresponding relation between the region number 110 and an extent number 321. In the present embodiment, an index (a second index) of the second table 320 is divided in units of the maximum number of extents allocable to a region.

Accordingly, when a region number is known, the range of extents allocable to a corresponding region is decided. As described below, the allocation of extents to a region may be dynamically controlled.

In order to check the extent number 210 corresponding to the region number 110 by using a logical address, an extent number index 311 is required in addition to the region number 110. The extent number index 311 indicates a relative position of an extent within the range which may be associated with the region number 110.

For example, the region number 110 is A (a bit number is 1), and the maximum number of extents allocable to a region is N ($=2^i$), and the extent number index 311 is E, the second index corresponding to these values may be calculated as $A \times 2^i + E$.

The extent number index 311 is stored in the first table 310. The first table 310 stores the extent number index 311 and an extent offset 312 according to a first index corresponding to each logical address.

When the region number 110 is A and the region offset 120 is B (a bit number is k), the first index corresponding to these values may be calculated as $A \times 2^k + B$.

The extent offset 220 of the physical address 200 corresponding to the logical address 100 may be known only by referring to the first table 310, but the extent number 210 of the physical address 200 may be known by referring to both the first table 310 and the second table 320.

Figure 6:
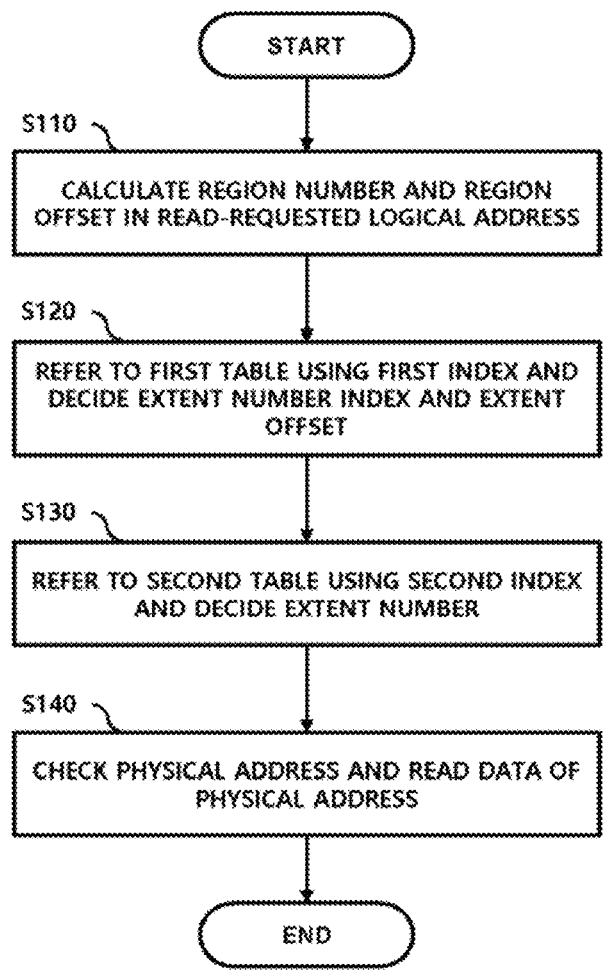
FIG. 6 is a flowchart illustrating a read operation when using an address mapping technology according to an embodiment of the present invention.

FIG. 6 is a flowchart illustrating a read operation when using an address mapping technology according to an embodiment of the present invention.

First, a region number and a region offset are calculated in a read-requested logical address (S110).

Next, the first table 310 is referred to using a first index calculated from the region number and the region offset, and an extent number index and an extent offset are decided (S120).

Then, the second table 320 is referred to using a second index calculated from the region number, the maximum number of extents allocable to a region, and the extent number index, and an extent number is decided (S130).

Last, a physical address is decided from the extent number and the extent offset and data of the physical address is read (S140).

Figure 7:
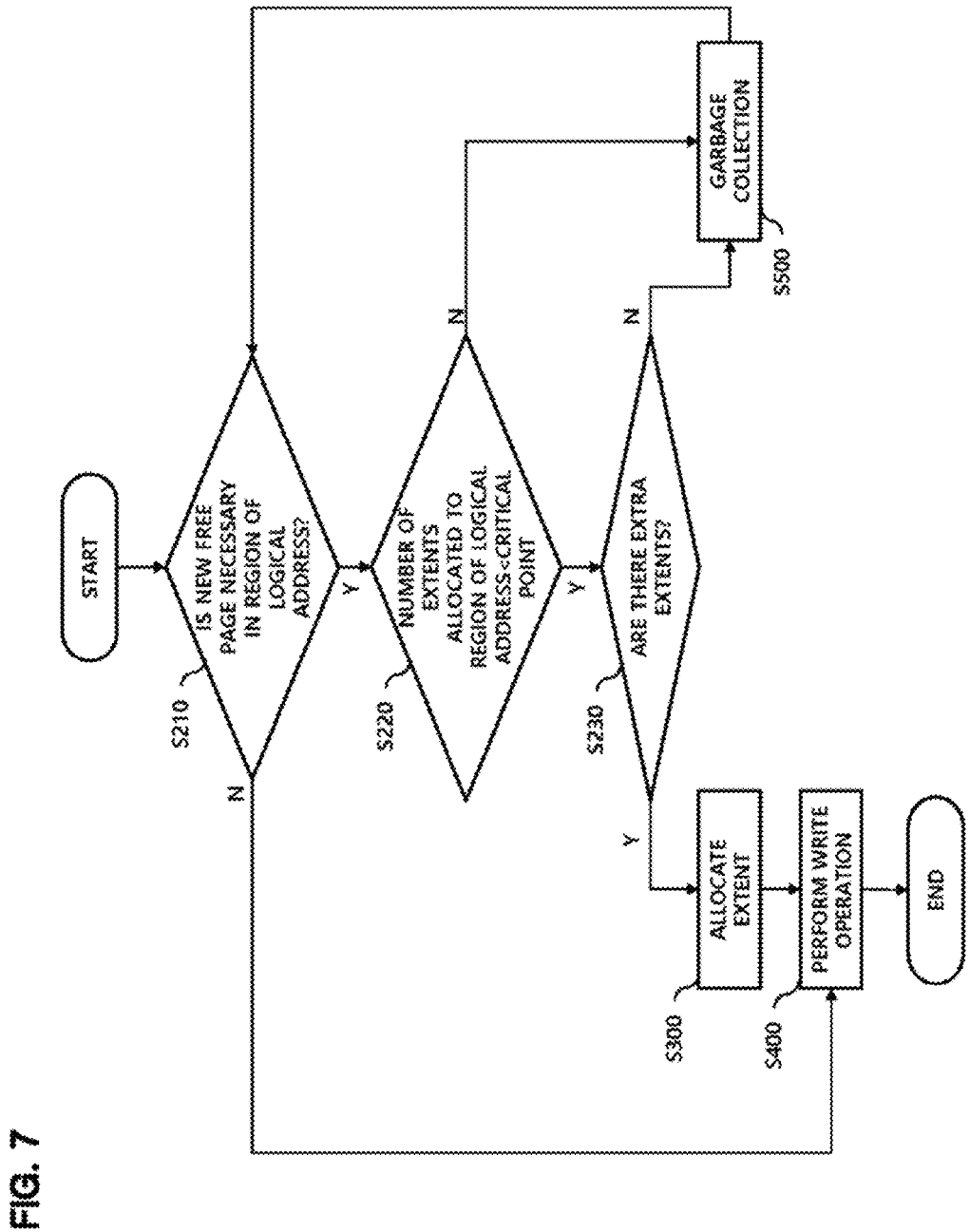
FIG. 7 is a flowchart illustrating a write operation when using an address mapping technology according to an embodiment of the present invention.

FIG. 7 is a flowchart illustrating a write operation when using the address mapping technology according to an embodiment of the present invention.

First, in order to store data of a write-requested logical address, it is determined whether a new free page is necessary (S210).

When a new free page is not necessary, a write operation is performed for a free page selected from existing free pages (S400).

When a new free page is necessary, it is determined whether the size of an extent allocated to a region is smaller than a critical point (S220). In the present embodiment, the value of the critical point is a maximum size of an extent allocable to a region, and is twice as large as the size of the region.

When the size of the extent allocated to the region is smaller than the critical point, it is determined whether there are extra extents allocable to the corresponding region (S230) and, other a garbage collection operation is performed (S500).

When there are extra extents as the determination result of step S230, the extra extents are allocated to the corresponding region (S300), and the write operation is performed (S400). The write operation is performed for a free page existing in an extent newly allocated to the region.

When there are no extra extents as the determination result of step S230, the garbage collection operation is performed (S500).

In the present embodiment, since the critical point is substantially the same as the maximum number of extents allocable to the region, when Yes is determined in step S220, Yes is also determined in step S230. However, when No is determined in step S220, No is also determined in step S230.

The garbage collection operation in step S500 may be performed by selecting an extent in which the number of valid pages is minimal. The garbage collection operation in step S500 may be performed by moving the valid page to another page of the selected extent or a page of another extent corresponding to substantially the same region number and erasing a block including only an invalid page.

Even when the garbage collection is performed (S500), information in the mapping table 300 should be updated. A mapping table update operation in the garbage collection may be easily known from a mapping table update operation in a write operation. That is, when the extra extents are allocated (S300) or the write operation is performed (S400), it is necessary to update information in the mapping table 300. This will be described with reference to FIG. 8 and FIG. 9.

Figure 8:
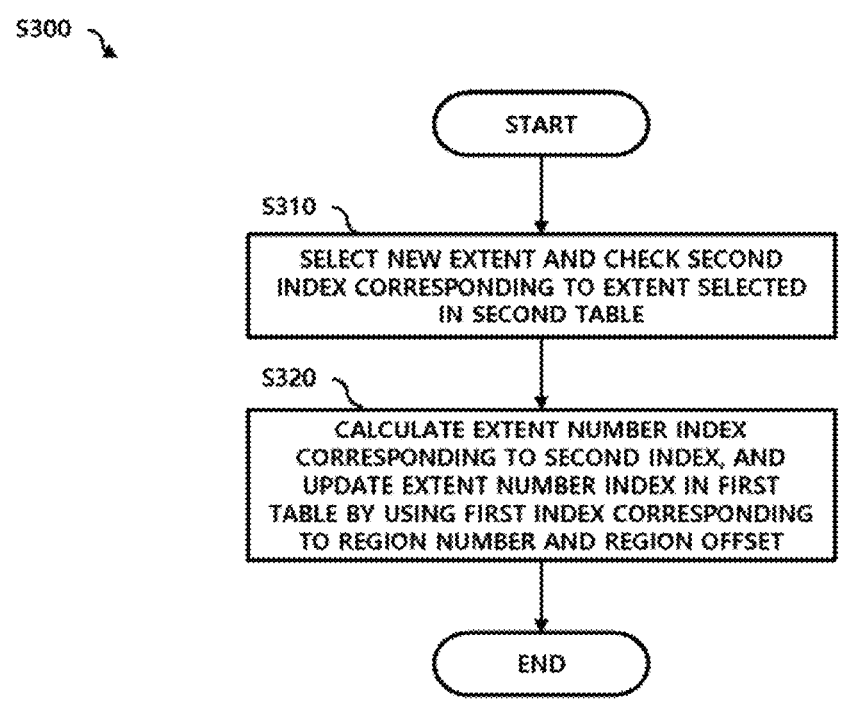
FIG. 8 is a flowchart illustrating an extent allocation operation of FIG. 7.

FIG. 8 is a flowchart illustrating in detail an extent allocation operation of FIG. 7.

First, an extent is selected from allocable extra extents in a region number of a write-requested logical address, and a second index corresponding to the number of the selected extent is checked in the second table 320 (S310).

Next, an extent number index is calculated from the checked second index, the region number, and the maximum number of extents allocable to each region, and the extent number index is updated in the first table 310 by using a first index corresponding to the region number and a region offset (S320).

Figure 9:
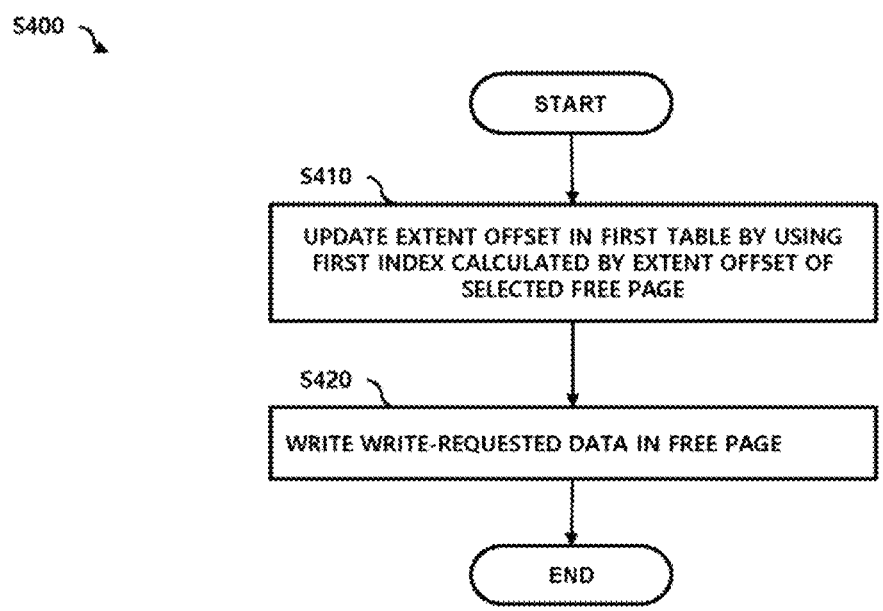
FIG. 9 is a flowchart illustrating the execution of a write operation FIG. 8.

FIG. 9 is a flowchart illustrating the execution of the write operation of FIG. 8.

When a free page is selected for the write operation, the first index corresponding to the region number and the region offset is calculated by an extent offset corresponding to the free page, and the extent offset is updated in the first table 310 by using the first index (S410).

Since the free page has been selected from extents corresponding to the write-requested region, an extent number has already been set to correspond to the write-requested region.

Then, write-requested data is written in the free page (S420).

Figure 10:
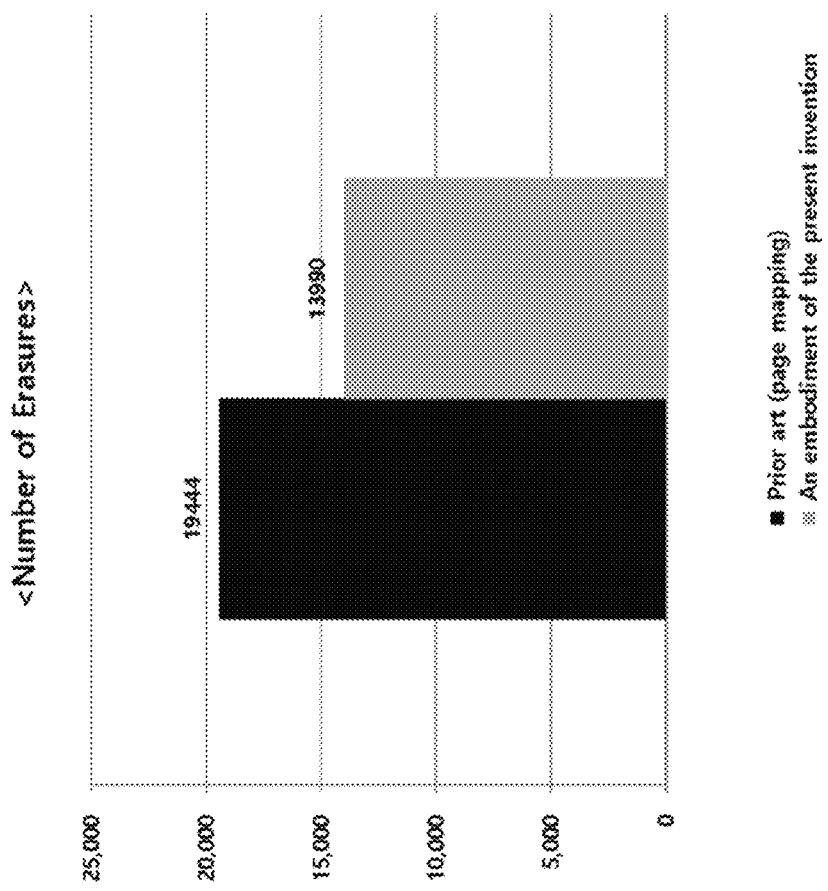
FIG. 10 is a graph illustrating the effects of the present invention.

FIG. 10 is a graph illustrating the effects of the present invention.

The experiment of FIG. 10 has been performed using eMMC with a capacity of 32 GB, wherein the size of a page is 16 KB, the size of a block is 2 MB, the size of an extent is 16 MB, and the size of a region is 128 MB.

In the experiment substantially the same read/write operations have been performed for employing the page mapping technology and employing the mapping technology according to the present invention.

As a result of the experiment, when employing the conventional page mapping technology, the number of erasures having been performed is 19,444, but when employing the mapping technology according to the present invention, the number of erasures is reduced to 13,990.

The erase operation has been performed in a garbage collection operation, and the operation performance has been improved as the number of garbage collections is reduced.

In the experiment, since the number of physical pages is 2 M (=32 GB/16 KB=$2^{14}$), the size of a mapping table is 14×L when the number of all logical addresses is L.

In the experiment, the number of extents is 2 K (=32 G/16 M), and a bit number of an extent number is 11 (=$\log_2 2K$), and a bit number of an extent offset is 3 (=14-11), and a maximum value of an extent offset index is 16 (=2×128 MB/16 MB), and a bit number of an extent number index is 4.

Accordingly, the size of the first table 310 is 7×L bits and the size of the second table 320 is (the number of regions)× 11 bits. When the entire number of logical page addresses is substantially the same as the entire number of physical page addresses, the number of regions (32 GB/128 MB) is significantly smaller than the number (32 GB/16 KB) of all logical addresses.

As a consequence, when using the concept outlined in the present invention, the size of the mapping table is reduced to about ½ as compared to when using the conventional page mapping technology.

While certain embodiments have been described above, will be understood to those skilled in the art that the embodiments are examples only. Accordingly, the semiconductor device and the operation method thereof described herein should not be limited based on the described embodiments. Rather, the encoding device, the semiconductor device and the operation method thereof described herein should only be limited in light of the claims that follow when taken in conjunction with the above description and accompanying drawings.

What is claimed is:

1. A semiconductor device comprising:
    a mapping table configured to store a corresponding relation between a logical address defined on a basis of regions and a physical address defined on a basis of extents;
    a memory cell array accessible using the physical address; and
    a control unit configured to convert between the logical address and the physical address and to update the corresponding relation between the logical address and the physical address while processing a read or write request and performing a garbage collection,
    wherein the control unit dynamically allocates one or more extents to one region,
    wherein the logical address includes a region number and a region offset and the physical address includes an extent number and an extent offset, and
    wherein the mapping table comprises:
    a first table configured to store the extent number index and the extent offset in a first index corresponding to the logical address; and
    a second table configured to store the extent number in a second index calculated by the region number and the extent number index.

2. The semiconductor device according to claim 1:
    wherein the region number indicates a number of a region to which the logical address belongs and the region offset indicates a relative position of the logical address in the region; and wherein the extent number indicates a number of an extent to which the physical address belongs and the extent offset indicates a relative position of the physical address in the extent.

3. The semiconductor device according to claim 1, wherein the second index is calculated by adding the extent number index to multiplication of the region number and a maximum number of extents allocated to the one region.

4. The semiconductor device according to claim 1, wherein, when a first data storage space exists in an extent corresponding to a write-requested logical address, the control unit stores write-requested data in the first data storage space.

5. The semiconductor device according to claim 4, wherein the control unit updates the first table by a first extent offset corresponding to the first data storage space to associate the write-requested logical address with the first data storage space.

6. The semiconductor device according to claim 4, wherein, when the first data storage space does not exist, the control unit allocates a new extent to a region including the write-requested logical address, and stores the write-requested data in a second data storage space associated with the new extent.

7. The semiconductor device according to claim 6, wherein the control unit updates the second table to associate the new extent with the region of the write-requested logical address, and updates the first table by an extent number index corresponding to the new extent, checked in the second table, and a second extent offset corresponding to the second data storage space to associate the write-requested logical address with the second data storage space.

8. The semiconductor device according to claim 6, wherein, when the new extent does not exist, the control unit performs garbage collection in extents corresponding to the region of the write-requested logical address.

9. An operating method of a semiconductor device, comprising:
storing a corresponding relation between a logical address including a region number and a region offset and a physical address including an extent number and an extent offset in first and second tables, wherein the first table stores an extent number index and the extent offset in a first index corresponding to the logical address, and the second table stores the extent number in a second index calculated by the region number and the extent number index;
checking a physical address corresponding to a read-requested logical address by referring to the first table and the second table in response to a read request; and
updating the first table or the second table in response to a write request.

10. The operating method according to claim 9, wherein the checking of the physical address comprises:
checking a region number and a region offset of the read-requested logical address;
checking an extent number index and an extent offset corresponding to the read-requested logical address by referring to the first table based on a first index corresponding to the read-requested logical address;
checking an extent number corresponding to the read-requested logical address by referring to the second table based on a second index obtained by combining the region number with the extent offset; and
checking the physical address corresponding to the read-requested logical address by combining the extent number with the extent offset.

11. The operating method according to claim 9, wherein the updating of the first or second table comprises:
checking a region number and a region offset of a write-requested logical address;
checking whether a first data storage space exists in an extent corresponding to the region number,
updating the first table by a first extent offset of the first data storage space when the first data storage space exists;
updating the second table by an extent number of an extent selected from extra extents allocable to a region corresponding to the region number when the first data storage space does not exist; and
updating the first table by an extent number index corresponding to the extent number and a second extent offset of a second data storage space of the selected extent.

12. The operating method according to claim 11, further comprising:
performing garbage collection in the extent corresponding to the region number when there are no extra extents allocable to the region.

13. The operating method according to claim 11, further comprising:
performing garbage collection in extents allocated to the region when a number of the extents allocated to the region is equal to or more than a critical point when the first data storage space does not exist.

* * * * *